(12) United States Patent
Kim

(10) Patent No.: US 8,154,301 B2
(45) Date of Patent: Apr. 10, 2012

(54) METHOD OF TESTING SUBSTRATE

(75) Inventor: Hyun Ho Kim, Gyunggi-do (KR)

(73) Assignee: Samsung Electro-Mechanics Co., Ltd., Suwon, Gyunggi-Do (KR)

(*) Notice: Subject to any disclaimer, the term of this patent is extended or adjusted under 35 U.S.C. 154(b) by 364 days.

(21) Appl. No.: 12/574,668

(22) Filed: Oct. 6, 2009

(65) Prior Publication Data

US 2011/0037481 A1 Feb. 17, 2011

(30) Foreign Application Priority Data

Aug. 12, 2009 (KR) .................. 10-2009-0074350

(51) Int. Cl.
*G01N 27/60* (2006.01)
(52) U.S. Cl. ........................ 324/452; 324/456
(58) Field of Classification Search ............ 324/452
See application file for complete search history.

(56) References Cited

U.S. PATENT DOCUMENTS

| | | | |
|---|---|---|---|
| 5,039,938 A * | 8/1991 | Kohnen et al. | 324/750.14 |
| 6,781,902 B2 * | 8/2004 | Oumiya et al. | 365/201 |
| 6,801,417 B2 * | 10/2004 | Arai et al. | 361/56 |
| 7,297,949 B2 * | 11/2007 | Nakasuji et al. | 250/307 |
| 7,724,003 B1 * | 5/2010 | Zhu et al. | 324/719 |

* cited by examiner

*Primary Examiner* — Thomas Valone
(74) *Attorney, Agent, or Firm* — Blakely Sokoloff Taylor & Zafman LLP

(57) ABSTRACT

Disclosed herein is a method of testing a substrate. In the method, a first test terminal is connected to a first external circuit layer coupled to a first connection pad of a first active element included in a substrate, and a second test terminal is connected to a second external circuit layer coupled to a second connection pad of the first active element. Static electricity is applied through the first test terminal and a voltage drop of an electrostatic discharge protection circuit of the first active element is measured at the second test terminal, thus testing a status of a connection between the first active element and the external circuit layers. In the method, status of a connection of a connection circuit layer, a connection of an external circuit layer, a connection of a surface mount element, and a normal operation of the substrate is further tested.

7 Claims, 4 Drawing Sheets

METHOD OF TESTING SUBSTRATE

CROSS REFERENCE TO RELATED APPLICATION(S)

This application claims the benefit of Korean Patent Application No. 10-2009-0074350, filed on Aug. 12, 2009, entitled "Method for Testing a Substrate", which is hereby incorporated by reference in its entirety into this application.

BACKGROUND OF THE INVENTION

1. Technical Field

The present invention relates to a method of testing a substrate.

2. Description of the Related Art

In most existing electronic manufacturing industries, active elements are mounted on a substrate using surface mount technology. However, in conformity with the trend towards small size of electronic appliances, a plurality of new packaging technologies enabling active elements to be included in a substrate has been developed.

In the case of a substrate including active elements, various types of active elements are integrated into the substrate, and thus it is predicted that the costs of manufacturing the substrate will decrease, and that the substrate will contribute to the realization of the small size of products as the substrate is used for products such as mobile phones.

Currently, the testing of substrates is required due to problems with the quality which occur during the manufacture and management of substrates, and this is required to guarantee the quality of products. Further, a more definite substrate test method is required in order to ensure the quality of substrates and solve several problems of the current substrate industry in which technologies have gradually changed to complicated and various forms, such as the realization of high level, high density, high functionality, high reliability and high minuteness.

A conventional method of testing a substrate is intended to test the performance of a substrate and examine mounting failures such as the misalignment, improper mounting and reverse mounting of parts and the exchange of polarities, and soldering failures such as insufficient soldering, excessive soldering and short circuits. That is, such an existing substrate test method is intended to measure only the open circuits or short circuits of the typical circuit patterns of a substrate, rather than measure a substrate including active elements.

Therefore, testing a substrate including active elements (for example, an RF transceiver, a digital & analog Baseband circuit, a Phasor Measurement Unit [PMU], Memory, an FM Radio circuit, etc.), using conventional substrate test methods, has limitations in providing a definite solution to the problem of guaranteeing the reliability of the substrate.

SUMMARY OF THE INVENTION

Accordingly, the present invention has been made keeping in mind the above problems occurring in the prior art, and the present invention is intended to provide a method of testing a substrate, which applies static electricity to external circuit layers connected to active elements included in a substrate and measures the voltage drop of electrostatic discharge protection circuits included in the active elements, thus testing the status of the connection between the active elements and the external circuit layers, and which applies a source to any one of external circuit layers connected to the active elements included in the substrate and measures a source output from another external circuit layer, thus detecting the status of the connection of connection circuit layers between the active elements included in the substrate without requiring a separate test circuit layer.

Further, the present invention is intended to provide a method of testing a substrate, which may further include testing the status of the connection between external circuit layers, the status of the connection of surface mount elements, and the status of normal operation of the substrate, thus detecting the status of the connection between circuit patterns formed on the substrate depending on a process for manufacturing the substrate.

In addition, the present invention is intended to provide a method of testing a substrate, which performs all of the above testing procedures on a completed substrate, thus detecting the status of the connection between all circuit patterns formed on the substrate.

In accordance with an aspect of the present invention, there is provided a method of testing a substrate, comprising (a) connecting a first test terminal to a first external circuit layer coupled to a first connection pad of a first active element included in the substrate and connecting a second test terminal to a second external circuit layer coupled to a second connection pad of the first active element, and (b) applying static electricity through the first test terminal and measuring a voltage drop of an electrostatic discharge protection circuit, included in the first active element, at the second test terminal, thus testing a status of a connection between the first active element included in the substrate and the first external circuit layers or the second external circuit layers.

The method may further comprise, after (b), (c) connecting a third test terminal to a third external circuit layer coupled to a first connection pad of a second active element included in the substrate and connecting a fourth test terminal to a fourth external circuit layer coupled to a first connection pad of a third active element, and (d) applying a source through the third test terminal and measuring a source output through the fourth test terminal, thus testing a status of a connection of a connection circuit layer for connecting the second active element to the third active element.

The method may further comprise, before (a), (e) connecting a fifth test terminal to a fifth external circuit layer of the substrate and connecting a sixth test terminal to a sixth external circuit layer coupled to the fifth external circuit layer through an internal circuit layer, and (f) applying a source to the fifth test terminal and measuring a source output through the sixth test terminal, thus testing a status of a connection between the fifth external circuit layer and the sixth external circuit layer.

The method may further comprise, after (d), (e) connecting a fifth test terminal to a fifth external circuit layer of the substrate and connecting a sixth test terminal to a sixth external circuit layer coupled to the fifth external circuit layer through an internal circuit layer, and (f) applying a source to the fifth test terminal and measuring a source output through the sixth test terminal, thus testing a status of a connection between the fifth external circuit layer and the sixth external circuit layer.

The method may further comprise, after (f), (g) connecting a seventh test terminal to a seventh external circuit layer coupled to a first pad of a surface mount element, mounted on a surface of the substrate, through an internal circuit layer, and connecting an eighth test terminal to an eighth external circuit layer coupled to a second pad of the surface mount element through an internal circuit layer, and (h) applying a source to the seventh test terminal and measuring a source output through the eighth test terminal, thus testing a status of a connection of the surface mount element.

The method may further comprise, after (h), (i) connecting an external power input terminal to an external connector of the substrate and supplying power to the external connector, thus testing a status of a normal operation of the substrate.

In addition, the present invention provides a method of testing a substrate, comprising (a) applying a source to a first test terminal connected to a first external circuit layer of the substrate and measuring a source, output from a second external circuit layer connected to the first external circuit layer through an internal circuit layer, at a second test terminal, thus testing a status of a connection between the first external circuit layer and the second external circuit layer, (b) applying static electricity to a third test terminal connected to a third external circuit layer connected to a first active element included in the substrate, and measuring a voltage drop of an electrostatic discharge protection circuit, included in the first active element, at a fourth test terminal, the voltage drop being output from a fourth external circuit layer connected to the first active element, thus testing a status of a connection between the first active element and the third external circuit layers or the fourth external circuit layers, (c) applying a source to a fifth test terminal connected to a fifth external circuit layer connected to a second active element included in the substrate, and measuring a source, output from a sixth external circuit layer connected to a third active element connected to the second active element through a connection circuit layer, at a sixth test terminal, thus testing a status of a connection of the connection circuit layer for connecting the second active element to the third active element, (d) applying a source to a seventh test terminal connected to a seventh external circuit layer connected to a surface mount element mounted on a surface of the substrate through an internal circuit layer, and measuring a source output from an eighth external circuit layer connected to the surface mount element through an internal circuit layer, at an eighth test terminal, thus testing a status of a connection of the surface mount element, and (e) supplying power to an external connector of the substrate, thus testing a status of a normal operation of the substrate.

DESCRIPTION OF THE PREFERRED EMBODIMENTS

Figure 1:
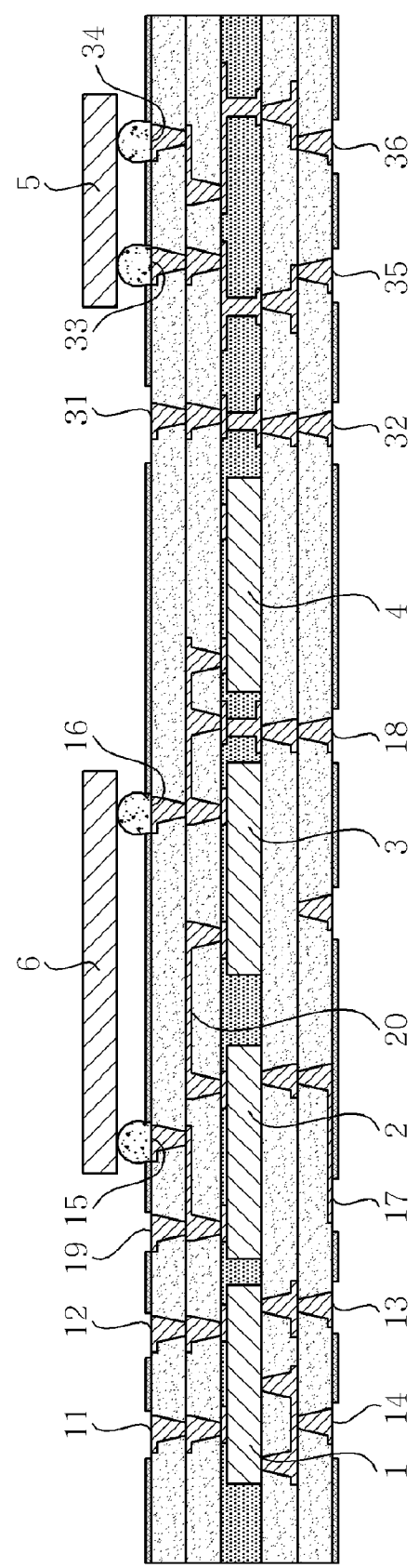
FIG. 1 is a sectional view of a substrate including active elements to which a test method according to an embodiment of the present invention is applicable.

The above and other objects, features and advantages of the present invention will be more clearly understood from the following detailed description taken in conjunction with the accompanying drawings.

Prior to giving the description, the terms and words used in the present specification and claims should not be interpreted as being limited to their typical meaning based on the dictionary definitions thereof, but should be interpreted to have the meaning and concept relevant to the technical spirit of the present invention, on the basis of the principle by which the inventor can suitably define the implications of terms in the way which best describes the invention.

The objects, features and advantages of the present invention will be more clearly understood from the following detailed description and preferred embodiments taken in conjunction with the accompanying drawings. In the present specification, reference now should be made to the drawings, in which the same reference numerals are used throughout the different drawings to designate the same or similar components. Further, in the description of the present invention, if detailed descriptions of related well-known constructions or functions are determined to make the gist of the present invention unclear, the detailed descriptions will be omitted.

Hereinafter, embodiments of the present invention will be described with the attached drawings.

FIG. 1 is a sectional view of a substrate including active elements to which a test method according to an embodiment of the present invention is applicable. The construction of the substrate to which the test method of the present invention is applicable will be described in brief with reference to FIG. 1.

As shown in FIG. 1, the substrate includes therein a plurality of active elements 1, 2, 3 and 4, and has two surface mount elements 5 and 6 mounted on the surface of the substrate. The active elements 1, 2, 3 and 4 may be semiconductor elements such as a Radio Frequency (RF) transceiver, a baseband chip, a Phasor Measurement Unit (PMU), memory, and a radio reception module, and the surface mount elements 5 and 6 may be passive elements such as a coil and a condenser, other than the active elements.

Further, on the substrate, a plurality of external circuit layers 11 to 19 and 31 to 36 is formed. The external circuit layers 11 to 19 are connected to the connection pads of the active elements, included in the substrate, through internal circuit layers, and the external circuit layers 31 to 36 are formed on one surface and the other surface of the substrate and are connected to each other through the internal circuit layers.

In this case, the internal circuit layers denote circuit patterns for connecting circuit layers which are formed on respective insulating layers and include via holes formed between the insulating layers of a multi-layer substrate.

Further, a connection circuit layer 20 denotes a circuit pattern for electrically connecting the included active elements to each other by coupling the active elements to each other. The connection circuit layer 20 functions to transfer signals between the active elements when the entire portion of the completed substrate is driven.

Further, connection pads (not shown) included in the active elements are circuit patterns for connecting the active elements to the external circuit layers through the internal circuit layers or connecting the included active elements to each other through the connection circuit layer. Although not shown in detail in FIG. 1, each of the active elements includes a plurality of connection pads.

Further, test terminals (not shown), which will be described later, are connection terminals, through which sources such as a voltage, a current and function test signals are applied and output values are measured so as to detect the status of the connection between circuit layers formed on the substrate.

Meanwhile, expressions such as 'first' and 'second' which will be described later are merely intended to allow the present invention to be easily described by arbitrarily designating any one of a plurality of active elements included in the substrate, any one of a plurality of connection pads of each active element, any one of a plurality of circuit layers, or any one of a plurality of test terminals, and no special meaning is assigned to the order of designation at the time of designating the above components.

Figure 2:
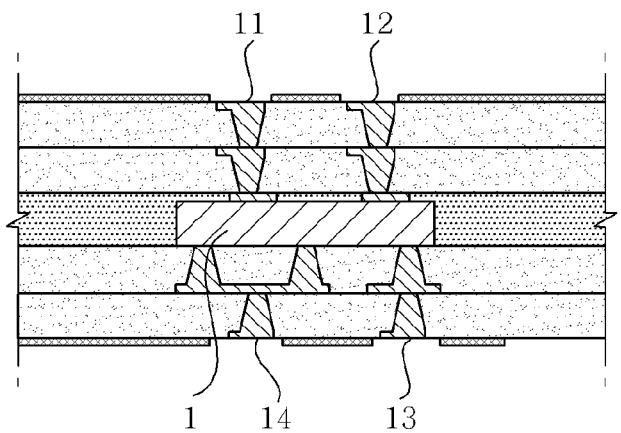
FIG. 2 is a sectional view showing part of a substrate including active elements to which a test method according to a first embodiment of the present invention is applicable.

FIG. 2 is a sectional view showing part of a substrate including active elements to which a test method according to a first embodiment of the present invention is applicable. Hereinafter, the testing of the status of the connection of an included active element according to the present embodiment will be described with reference to FIG. 2.

The method of testing a substrate according to the present embodiment includes applying static electricity through a first test terminal (not shown) by connecting the first test terminal to a first external circuit layer 11, and measuring the voltage drop of an electrostatic discharge protection circuit, which is output from a second external circuit layer 13 by connecting a second test terminal (not shown) to the second external circuit layer 13, thus testing the status of the connection of the included active element 1.

Such a test method enables the status of the connection between an included active element and a specific external circuit layer to be detected, unlike a conventional substrate test method in which only the open/short status of the entire circuit layer is detected, thus guaranteeing the reliability of the entire substrate.

First, the first test terminal is connected to the first external circuit layer 11 coupled to the first connection pad of the first active element 1 included in the substrate, and the second test terminal is connected to the second external circuit layer 13 coupled to the second connection pad of the first active element 1.

This procedure is the preparation for detecting the status of the connection between the first active element and the external circuit layers 11 and 13.

Meanwhile, in the present invention, the first external circuit layer 11 and the second external circuit layer 13 are formed on different surfaces of the substrate, but this is only an example, and the first and second external circuit layers 11 and 13 may also be formed on the same surface of the substrate through internal circuit layers.

Next, static electricity is applied through the first test terminal, and the voltage drop of the electrostatic discharge protection circuit included in the first active element 1 is measured at the second test terminal, and thus the status of the connection between the first active element and the first external circuit layer or between the first active element and the second external circuit layer is tested.

In this case, static electricity applied to the first test terminal is a concept including means including an electrostatic current and an electrostatic voltage. Further, the term "electrostatic discharge: ESD" means a phenomenon in which, when mutually insulated objects come into contact with each other, a current corresponding to a very large voltage difference between the objects instantaneously flows. When a high voltage attributable to an ESD current flows into an active element, the internal circuit of the active element may be broken down. Accordingly, most active elements include an electrostatic discharge protection circuit between input/output (I/O) pads and an internal circuit so as to protect the internal circuit.

Such an electrostatic discharge protection circuit protects an internal circuit in such a way that, while the relevant active element is normally operated, the protection circuit is in an open state in which connection is not made, and that, when an ESD current flows from I/O pads into the active element, the protection circuit is in a connection state, so that an ESD current flowing from the I/O pads to a supply voltage terminal Vss or a ground voltage terminal Vdd when the ESD current flows into the protection circuit from the I/O pads, thus protecting the internal circuits.

In more detail, the ESD protection circuit includes ESD protection elements (for example, ESD protection diodes) between the I/O pads and a supply voltage terminal Vdd and between the I/O pads and a ground voltage terminal Vss. The ESD protection circuit protects the internal circuit by discharging an excessive current, flowing into the I/O pads, to the supply voltage terminal or the ground voltage terminal through the ESD protection elements.

Therefore, the first external circuit layer 11 is connected to the I/O pad of the active element, or a connection pad coupled to the I/O pad, and the second external circuit layer 13 is connected to the connection pad coupled to the supply voltage terminal or the ground voltage terminal of the ESD protection circuit included in the active element.

In this case, static electricity applied to the first test terminal may differ depending on whether the second test terminal is connected to an external circuit layer coupled to the supply voltage terminal, or an external circuit layer coupled to the ground voltage terminal.

First, when the second test terminal is connected to the supply voltage terminal, a positive electrostatic voltage or current is applied to the first test terminal. Further, when the second test terminal is connected to the ground voltage terminal, a negative electrostatic voltage or current is applied to the first test terminal. Therefore, a positive voltage or current is measured at the second test terminal connected to the supply voltage terminal, and a negative voltage or current is measured at the second test terminal connected to the ground voltage terminal.

Therefore, unless the first external circuit layer 11, the first active element 1 and the second external circuit layer 13 are electrically connected to each other, any voltage or current will not be measured at the second test terminal.

In this case, methods of applying static electricity are digital current/voltage application methods, which may include, for example, voltage force current measure (VFIM) and current force voltage measure (IFVM).

VFIM is a method implemented using a combination of an ammeter circuit and a constant voltage source and configured to apply a voltage through the first test terminal and measure a current value, output from the second external circuit layer 13, at the second test terminal. In VFIM, it is recognized that the external circuit layers 11 and 13 and the included active element have been normally connected to each other by measuring the current at the second test terminal.

IFVM is a method implemented using a constant current source circuit and a voltmeter and configured to apply a current to the first external circuit layer through the first test terminal and measure a voltage value, output from the second external circuit layer 13 at that time, at the second test terminal. In IFVM, it is recognized that the external circuit layers 11 and 13 and the included active element have been normally connected to each other by measuring the voltage at the second test terminal.

In this case, in order to increase the range of measurement of a voltage or current output through the second test terminal, it is more profitable to use an 'all-of-pin-grounding' scheme enabling external circuit layers, to which test terminals are not connected, to be grounded, unlike the above-described pin-to-pin scheme, at the time of measuring a voltage or current at the second test terminal.

If a voltage or current is not measured at the second test terminal, it is possible to connect the first test terminal to some other external circuit layer 12 other than the first external circuit layer 11, apply static electricity to the other external circuit layer 12, and measure a resulting value at the second test terminal, thus testing the status of the connection between the first external circuit layer 11 and the active element 1 and the connection between the other external circuit layer 12 and the active element 1.

Further, it is possible to connect the second test terminal to some other external circuit layer 14 coupled to the pads of the supply voltage terminal and the ground voltage terminal, apply static electricity to the first external circuit layer 11, and measure a resulting value at the second test terminal, thus testing the status of the connection between the second external circuit layer 13 and the active element 1 and the connection between the other external circuit layer 14 and the active element 1.

Through the use of this method, the status of each of the connection between the first external circuit layers 11 and 12 and the first active element 1 and the connection between the first active element 1 and the second external circuit layers 13 and 14, as well as the status of the entire connection between the first external circuit layers 11 and 12, the first active element 1, and the second external circuit layers 13 and 14, may be detected.

Figure 3:
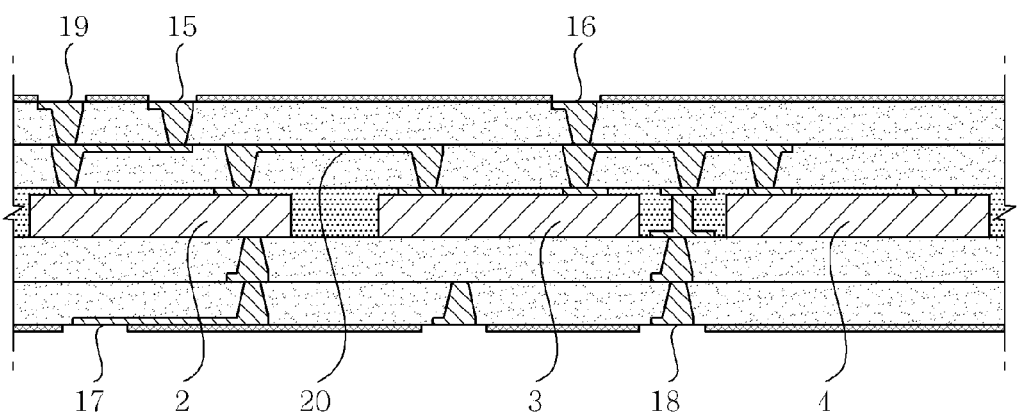
FIG. 3 is a sectional view showing part of a substrate including active elements to which a test method according to a second embodiment of the present invention is applicable.

FIG. 3 is a sectional view showing part of a substrate including active elements to which a test method according to a second embodiment of the present invention is applicable. Hereinafter, the testing of the status of the connection of a connection circuit layer according to the present embodiment will be described with reference to FIG. 3.

The substrate test method according to the present embodiment further includes applying a source through a third test terminal (not shown) by connecting the third test terminal to a third external circuit layer 15 coupled to a second active element 2, and measuring a source output from a fourth external circuit layer 16 coupled to a third active element by connecting a fourth test terminal (not shown) to the fourth external circuit layer 16, thus testing the status of the connection of a connection circuit layer 20.

The substrate test method according to the present embodiment is preferably performed after the status of the connection between the second active element 2 and the third external circuit layer 15 and the connection between the third active element 3 and the fourth external circuit layer 16 has been detected through the above testing of the status of the connection of included active elements.

Such a test method enables the connectivity of the connection circuit layer 20 to be tested without a separate circuit layer being externally connected to the connection circuit layer 20, and thus the configuration of the design of a substrate is not limited.

First, the third test terminal is connected to the third external circuit layer 15 coupled to the first connection pad of the second active element 2 included in the substrate, and the fourth test terminal is connected to the fourth external circuit layer 16 coupled to the first connection pad of the third active element 3. This procedure is the preparation for detecting the status of the connection of the connection circuit layer 20.

Thereafter, a source is applied through the third test terminal, and a source output through the fourth test terminal is measured, and thus the status of the connection of the connection circuit layer 20 between the second active element 2 and the third active element 3 is tested.

Here, the term "source" means an expression to designate in common all elements that can be applied to test the connectivity of the connection circuit layer 20, and may be a voltage, a current, function test signals, etc.

In this case, the measurement of voltage and current sources is performed by a digital current/voltage test. The digital voltage/current test may be, for example, voltage force current measure (VFIM) and current force voltage measure (IFVM), as described above.

Further, the function test signals may be applied. The function test signals are differently applied depending on the characteristics of respective active elements, and are applied after power has been connected to the active elements. In order to suitably apply function test signals, it is preferable to recognize the properties of included elements in advance. As function test signals, a Radio Frequency (RF) signal, a digital signal, an analog signal and a mixed signal may be applied depending on the types of active elements.

When a test signal is applied through the third test terminal and a resulting value of the test signal is measured at the fourth test terminal through the active elements 2 and 3, it can be seen that the connection circuit layer 20 has been connected.

Such function test signals are applied and output signals are examined, and thus whether a known-good-die (KGD) has been acquired may also be determined. At the time of separately examining whether a KGD has been acquired, the problems of costs and a delay in the production of products may occur. However, whether a KGD has been acquired may be determined simultaneously with the testing of the connection circuit layer 20, thus realizing the effects of reducing costs and improving productivity.

In order to examine whether a KGD has been acquired, as described above, it is preferable to integrate Design For Testability (DFT) technology with the KGD examination. By way of example, a boundary-scan test, a built in self test, etc. may be implemented.

Figure 4:
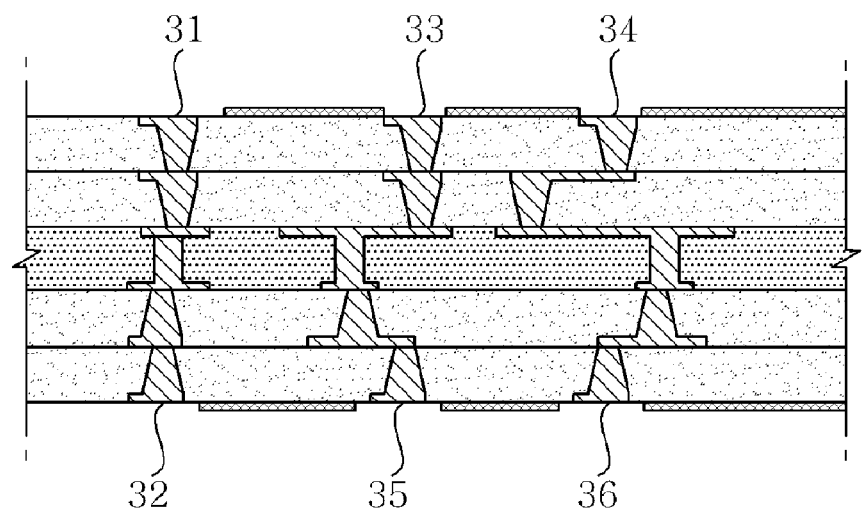
FIG. 4 is a sectional view showing part of a substrate including active elements to which a test method according to a third embodiment of the present invention is applicable.

FIG. 4 is a sectional view showing part of a substrate including active elements to which a test method according to a third embodiment of the present invention is applicable. Hereinafter, the testing of the status of the connection between external circuit layers according to the present embodiment will be described in detail.

The method of testing a substrate according to the present embodiment further includes, before testing the status of the connection of an included active element or after testing the status of the connection of a connection circuit layer, applying a source through a fifth test terminal (not shown) by connecting the fifth test terminal to the fifth external circuit layer 31 of the substrate, and measuring a source, output from a sixth external circuit layer 32, by connecting a sixth test terminal (not shown) to the sixth external circuit layer 32, thus testing the status of the connection between the fifth external circuit layer 31 and the sixth external circuit layer 32.

The testing according to the present embodiment may be performed regardless of the above-described testing of the status of connection in the above embodiments. The reason for this is that the present testing is a test operation of determining the status of the connection of circuit patterns which are not related to a plurality of included active elements 1 to 4.

Therefore, after the testing of the status of the connection between external circuit layers 31 and 32, 33 and 35, and 34 and 36 is primarily performed, the testing of the status of the connection of an included active element (refer to FIG. 2), the testing of the status of the connection of a connection circuit layer (refer to FIG. 3), the testing of the status of the connection of a surface mount element, which will be described later (refer to FIG. 5), and the testing of the status of normal operation of the substrate may be successively performed depending on the process for manufacturing the substrate or on a completed substrate.

In contrast, when the testing of the status of the connection between the external circuit layers is performed after the testing of the status of the connection of an included active element and the testing of the status of the connection of a connection circuit layer have been performed, the reliability of the circuit patterns related to the active elements is checked, and thereafter whether typical circuit patterns have been connected is determined. Accordingly, connection failures on circuit patterns between the active elements and the external circuit layers, in which connection failures occur most frequently, and on portions of a connection circuit layer, are primarily recognized. As a result, effort to perform tests on a bad substrate, on which connection failures occurred, may be eliminated. Accordingly, unnecessary operations are prevented from being performed on a bad substrate.

That is, unlike the conventional technology in which, after a targeted final substrate has been formed, the completion of the substrate is determined using only the testing of the entire substrate, the present invention separately tests the status of the connection between external circuit layers coupled to the active elements, and also tests the status of the connection between typical external circuit layers 31 and 32, 33 and 35, and 34 and 36, thus examining whether a bad substrate has occurred even in the intermediate stage of the manufacturing process.

First, the fifth test terminal is connected to the fifth external circuit layer 31 of the substrate, and the sixth test terminal is connected to the sixth external circuit layer 32, and thus the preparation for applying a source is completed.

Thereafter, a source is applied to the fifth test terminal and a source output from the sixth external circuit layer 32 through the internal circuit layer is measured at the sixth test terminal, and thus the status of the connection between the fifth external circuit layer 31 and the sixth external circuit layer 32 is tested.

Here, the sources may be a voltage and a current, and the status of the connection of the connection circuit layer is detected through an open/short test.

In this case, the open test is performed such that a constant voltage is applied to the fifth external circuit layer 31 through the fifth test terminal and a voltage output from the sixth external circuit layer 32 is measured at the sixth test terminal. A voltmeter is connected in parallel with the fifth test terminal and the sixth test terminal and is configured to measure a voltage. When the value measured by the voltmeter does not reach the constant voltage, it can be seen that the fifth external circuit layer 31 is connected to the sixth external circuit layer 32.

Further, the short test is performed such that a constant voltage is applied to the fifth test terminal and a current flowing out through the sixth test terminal is measured. An ammeter is connected in series with the fifth test terminal and the sixth test terminal, and is configured to measure a current between the fifth external circuit layer 31 and the sixth external circuit layer 32. When the current is measured by the ammeter, it can be seen that the fifth external circuit layer 31 is connected to the sixth external circuit layer 32.

Figure 5:
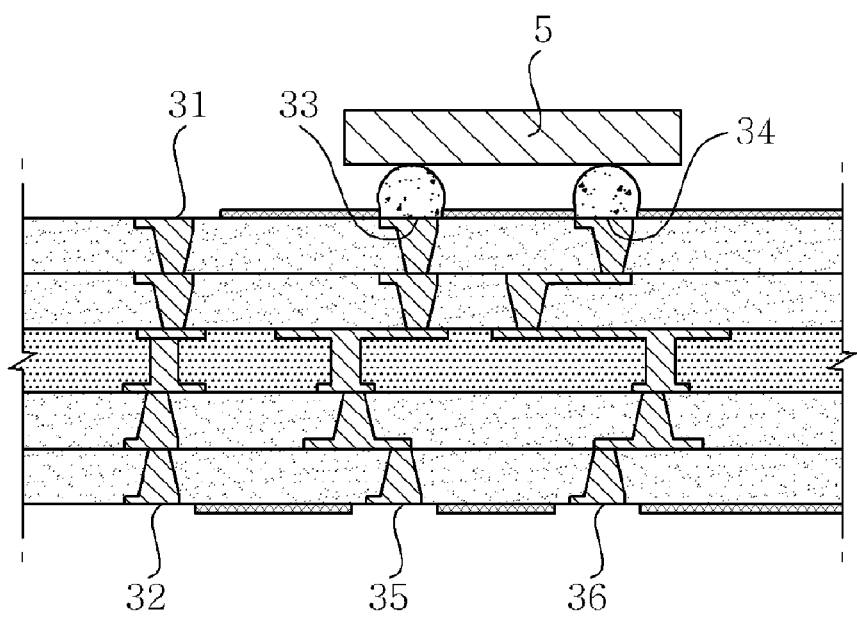
FIG. 5 is a sectional view showing part of a substrate including active elements to which a test method according to a fourth embodiment of the present invention is applicable.

FIG. 5 is a diagram showing part of a substrate including active elements to which a test method according to a fourth embodiment of the present invention is applicable. Hereinafter, the testing of the status of the connection of a surface mount element according to the present embodiment will be described with reference to FIG. 5.

The substrate test method according to the present embodiment may further include, after the above testing of the status of the connection between external circuit layers, applying a source through a seventh test terminal (not shown) by connecting the seventh test terminal to a seventh external circuit layer 35 coupled to the first pad of a surface mount element 5 through an internal circuit layer, and measuring a source, output from an eighth external circuit layer 36 coupled to the second pad of the surface mount element through an internal circuit layer, at an eighth test terminal (not shown) by connecting the eighth test terminal to the eighth external circuit layer 36, thus testing the status of the connection of the surface mount element 5.

In this case, the surface mount element 5 may include an active element and a passive element, may be differently mounted according to the purpose of manufacturing the substrate, and may be mounted such that several elements are mounted on different circuit layers (for example, an external circuit layer and a connection circuit layer).

The testing according to the present embodiment may be preferably performed such that the status of the connection between external circuit layers is detected by primarily performing the testing of the status of the connection between the external circuit layers, as described above with reference to FIG. 4, on the circuit layers 33 and 34 on which the surface mount element 5 is mounted, the surface mount element 5 is mounted on the surface of the substrate, and thereafter the testing of the present embodiment is performed.

Here, the first and second pads of the surface mount element 5 are respectively connected to external circuit layers formed on the top surface of the substrate through a solder ball method or the like. The first and second pads of the surface mount element 5 on the substrate are respectively connected to the seventh external circuit layer 35 and the eighth external circuit layer 36 formed on the bottom surface of the substrate through internal circuit layers.

First, the preparation for applying a source is performed by connecting the first test terminal to the seventh external circuit layer 35 and connecting the second test terminal to the eighth external circuit layer 36.

Thereafter, a source is applied to the seventh test terminal, and a source output from the eighth external circuit layer 36 is measured at the eighth test terminal. In this case, the source input through the first test terminal may be a voltage, a current or static electricity, as described above.

Meanwhile, when the surface mount element 5 is an active element, measurement is performed using a digital current/voltage test method by applying static electricity, as described above, and is performed by applying a function test signal. Further, when the surface mount element 5 is a passive element, the status of the connection thereof is detected through the above-described open/short test.

The substrate test method according to a fifth embodiment of the present invention may further include, after the testing of the status of the connection of the surface mount element, supplying power to the external connector of the substrate, thus testing the status of normal operation of the substrate.

Such testing is a procedure for examining whether the substrate has been sufficiently completed to such an extent that the substrate can be applied to products.

First, an external power input terminal (not shown) is connected to the external connector (not shown) of the substrate. This is intended to input power to the entire substrate. Thereafter, the power is supplied to the external connector.

In this case, when the substrate is manufactured in conformity with the purpose thereof, a plurality of included active elements (refer to FIG. 1) and surface mount elements (refer to FIG. 1) are individually operated by the power supplied through the external connector of the substrate, and respective source values may be measured on all circuit layers formed on the external portion of the substrate. At this time, source values are finally checked on all circuit layers, and thus the testing of the substrate is terminated.

Further, the status of normal operation of the substrate may be tested by applying the substrate including active elements to a final product, supplying power to the product, and then determining whether the target function of the product has been sufficiently performed.

Figure 6:
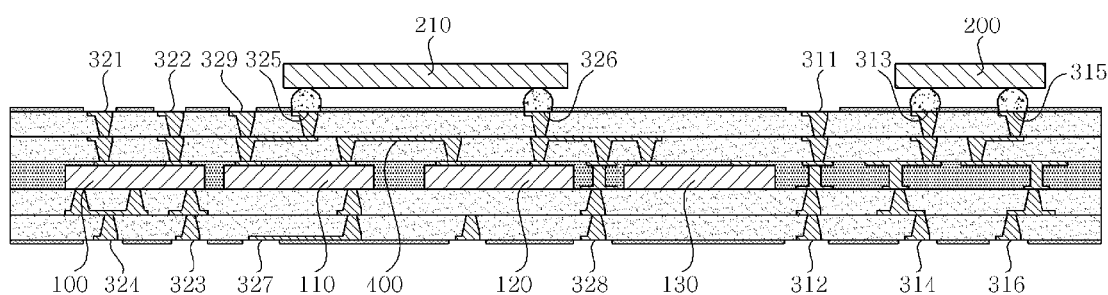
FIG. 6 is a sectional view of a substrate including active elements to which a test method according to a sixth embodiment of the present invention is applicable.

FIG. 6 is a sectional view of a substrate including active elements to which a test method according to a sixth embodiment of the present invention is applicable. Hereinafter, the substrate test method according to the present embodiment will be described.

The substrate of FIG. 6 is a completed substrate that can be applied to a product, and has the same construction as that of FIG. 1, but merely has reference numerals different from those of FIG. 1 in order to definitely describe the test method according to the present embodiment.

Further, after a plurality of test terminals (not shown) is connected to all external circuit layers formed on the substrate, sources are applied only to test terminals required for testing, which will be described later, and output sources are respectively measured, thus enabling testing to be successively performed. In this case, inconvenience of performing testing while shifting to test terminals in respective test operations may be overcome.

In particular, unlike the method in which some of circuit patterns formed on the substrate are individually tested, the test method according to the present embodiment is configured to test the status of the connections between all the circuit patterns of the substrate of FIG. 6 in stages, to provide a definite solution to the problem of guaranteeing the reliability of the completed substrate, and to present a universal course at the time of testing the status of the connection of the substrate including active elements.

First, the status of the connection between the external circuit layers is tested. The external circuit layers are layers which are not related to the active elements included in the substrate, and the status of the connection therebetween is tested by performing an open/short test.

An open/short test is performed using the same method as the above testing, described in the third embodiment with reference to FIG. 4. For example, such an open/short test is performed in such a way as to apply a source to a first test terminal (not shown) connected to the first external circuit layers 311, 313 and 315 of the substrate and measure a source output through the second test terminal (not shown) connected to the second external circuit layers 312, 314 and 316 which are coupled to the first external circuit layers 311, 313 and 315 through internal circuit layers.

Since the connection between the external circuit layers is typically made on a multi-layer substrate and forms a basic structure for inter-layer connection, such a connection is tested first.

Next, the status of the connection of each active element is tested. For example, the status of the connection between a first active element 100 and external circuit layers 321, 322, 323 and 324 is tested by measuring the voltage drop of the ESD protection circuit included in the first active element 100.

The measurement of the voltage drop of the ESD protection circuit is performed using the same testing operation as that described in the first embodiment with reference to FIG. 2. For example, such a measurement is performed in such a way as to apply static electricity through a third test terminal (not shown) by connecting the third test terminal to the third external circuit layer 321 coupled to the first active element 100 and to measure a voltage drop at a fourth test terminal (not shown) connected to the fourth external circuit layers 323 and 324 coupled to the first active element.

Thereafter, the status of the connection of a connection circuit layer is tested. This testing is performed using the same method as that described in the second embodiment with reference to FIG. 3. For example, this testing is performed in such a way as to apply a source through a fifth test terminal (not shown) by connecting the fifth test terminal to fifth external circuit layers 325 and 329 coupled to a second active element 110 and to measure a source output through a sixth test terminal (not shown) connected to sixth external circuit layers 326 and 328 coupled to a third active element 120.

Such a connection circuit layer 400 is formed in the internal layer of the substrate, and is configured such that, even if the connection circuit layer 400 is not directly connected to the external circuit layers, the status of the connection thereof can be indirectly tested using external circuit layers 325 and 326 connected to the included active elements 110 and 120 without a separate test circuit pattern being formed in the connection circuit layer 400.

Further, the status of the connection of the surface mount element is tested. This testing is performed using the same method as that described in the fourth embodiment with reference to FIG. 5. For example, this testing is performed in such a way as to apply a source through a seventh test terminal (not shown) by connecting the seventh test terminal to the seventh external circuit layer 314 and measure a source output through an eighth test terminal (not shown) connected to the eighth external circuit layer 316 coupled to the surface mount element 200 through internal circuit layers.

Finally, the status of normal operation of the substrate is tested. The present testing is identical to the testing described in the fifth embodiment, and thus a detailed description thereof is omitted.

The status of the connection between all circuit patterns formed on the substrate may be detected by sequentially performing the above testing operations. When the testing operations are successively performed, an error causing any one testing operation to be skipped by some mistake may be minimized, thus guaranteeing the reliability of the substrate.

As described above, the present invention is advantageous in that it can individually detect the status of the connection between active elements included in a substrate and the external circuit layers of the substrate, and can detect the status of the connection of connection circuit layers, formed in the internal layer of the substrate, outside of the substrate, without requiring a separate test circuit layer.

Further, the present invention is advantageous in that the status of the connection between external circuit layers included in the substrate, the status of the connection of surface mount elements, and the status of normal operation of the entire substrate are individually tested, so that the substrate including active elements can be tested in stages, thus improving the reliability of the entire substrate.

Furthermore, the present invention is advantageous in that all of the above testing operations are performed on a completed substrate, thus finally detecting the status of the connection of all circuit patterns formed on the substrate.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of testing a substrate, comprising:
   (a) connecting a first test terminal to a first external circuit layer coupled to a first connection pad of a first active element included in the substrate and connecting a second test terminal to a second external circuit layer coupled to a second connection pad of the first active element; and
   (b) applying static electricity through the first test terminal and measuring a voltage drop of an electrostatic discharge protection circuit, included in the first active element, at the second test terminal, thus testing a status of a connection between the first active element included in the substrate and the first external circuit layers or the second external circuit layers.

2. The method as set forth in claim 1, further comprising, after (b):
   (c) connecting a third test terminal to a third external circuit layer coupled to a first connection pad of a second active element included in the substrate and connecting a fourth test terminal to a fourth external circuit layer coupled to a first connection pad of a third active element; and
   (d) applying a source through the third test terminal and measuring a source output through the fourth test terminal, thus testing a status of a connection of a connection circuit layer for connecting the second active element to the third active element.

3. The method as set forth in claim 1, further comprising, before (a):
   (e) connecting a fifth test terminal to a fifth external circuit layer of the substrate and connecting a sixth test terminal to a sixth external circuit layer coupled to the fifth external circuit layer through an internal circuit layer; and
   (f) applying a source to the fifth test terminal and measuring a source output through the sixth test terminal, thus testing a status of a connection between the fifth external circuit layer and the sixth external circuit layer.

4. The method as set forth in claim 2, further comprising, after (d):
   (e) connecting a fifth test terminal to a fifth external circuit layer of the substrate and connecting a sixth test terminal to a sixth external circuit layer coupled to the fifth external circuit layer through an internal circuit layer; and
   (f) applying a source to the fifth test terminal and measuring a source output through the sixth test terminal, thus testing a status of a connection between the fifth external circuit layer and the sixth external circuit layer.

5. The method as set forth in claim 4, further comprising, after (f):
   (g) connecting a seventh test terminal to a seventh external circuit layer coupled to a first pad of a surface mount element, mounted on a surface of the substrate, through an internal circuit layer, and connecting an eighth test terminal to an eighth external circuit layer coupled to a second pad of the surface mount element through an internal circuit layer; and
   (h) applying a source to the seventh test terminal and measuring a source output through the eighth test terminal, thus testing a status of a connection of the surface mount element.

6. The method as set forth in claim 5, further comprising, after (h):
   (i) connecting an external power input terminal to an external connector of the substrate and supplying power to the external connector, thus testing a status of a normal operation of the substrate.

7. A method of testing a substrate, comprising:
   (a) applying a source to a first test terminal connected to a first external circuit layer of the substrate and measuring a source, output from a second external circuit layer connected to the first external circuit layer through an internal circuit layer, at a second test terminal, thus testing a status of a connection between the first external circuit layer and the second external circuit layer;
   (b) applying static electricity to a third test terminal connected to a third external circuit layer connected to a first active element included in the substrate, and measuring a voltage drop of an electrostatic discharge protection circuit, included in the first active element, at a fourth test terminal, the voltage drop being output from a fourth external circuit layer connected to the first active element, thus testing a status of a connection between the first active element and the third external circuit layers or the fourth external circuit layers;
   (c) applying a source to a fifth test terminal connected to a fifth external circuit layer connected to a second active element included in the substrate, and measuring a source, output from a sixth external circuit layer connected to a third active element connected to the second active element through a connection circuit layer, at a sixth test terminal, thus testing a status of a connection of the connection circuit layer for connecting the second active element to the third active element;
   (d) applying a source to a seventh test terminal connected to a seventh external circuit layer connected to a surface mount element mounted on a surface of the substrate through an internal circuit layer, and measuring a source output from an eighth external circuit layer connected to the surface mount element through an internal circuit layer, at an eighth test terminal, thus testing a status of a connection of the surface mount element; and
   (e) supplying power to an external connector of the substrate, thus testing a status of a normal operation of the substrate.

* * * * *